United States Patent
Wang et al.

(10) Patent No.: US 11,418,207 B1
(45) Date of Patent: Aug. 16, 2022

(54) ANALOG-TO-DIGITAL CONVERTER DEVICE EQUIPPED WITH CONVERSION SUSPENSION FUNCTION, AND OPERATION METHOD THEREOF

(71) Applicants: Artery Technology Co., Ltd., Chongqing (CN); FARADAY TECHNOLOGY CORPORATION, Suzhou (CN)

(72) Inventors: Zhengxiang Wang, Suzhou (CN); Feng Xu, Suzhou (CN); Wei-Tai Tsai, Hsin-Chu (TW); Chiao-Wen Lo, Hsin-Chu (TW)

(73) Assignees: Artery Technology Co., Ltd., Chongqing (CN); FARADAY TECHNOLOGY CORPORATION, Suzhou (CN)

( * ) Notice: Subject to any disclaimer, the term of this patent is extended or adjusted under 35 U.S.C. 154(b) by 0 days.

(21) Appl. No.: 17/355,173

(22) Filed: Jun. 23, 2021

(30) Foreign Application Priority Data

Mar. 11, 2021 (CN) .......................... 202110263454.8

(51) Int. Cl.
*H03M 1/12* (2006.01)
*H03M 1/46* (2006.01)

(52) U.S. Cl.
CPC ....... *H03M 1/1215* (2013.01); *H03M 1/1245* (2013.01); *H03M 1/462* (2013.01)

(58) Field of Classification Search
CPC ... H03M 1/1215; H03M 1/1245; H03M 1/462
USPC ........................................................ 341/155
See application file for complete search history.

(56) References Cited

U.S. PATENT DOCUMENTS

| 5,138,319 A | 8/1992 | Tesch | |
| 2002/0080055 A1* | 6/2002 | Tsai | H04N 5/335 348/E5.091 |
| 2015/0280726 A1* | 10/2015 | Terazawa | H03M 1/62 341/157 |
| 2021/0143830 A1* | 5/2021 | Xu | H03M 1/204 |

FOREIGN PATENT DOCUMENTS

| TW | I644519 B | 12/2018 |
| WO | 02/059632 A1 | 8/2002 |

* cited by examiner

*Primary Examiner* — Peguy Jean Pierre
(74) *Attorney, Agent, or Firm* — Winston Hsu

(57) ABSTRACT

An analog-to-digital converter (ADC) device equipped with a conversion suspension function and an associated operation method thereof are provided. The ADC device includes: an interleaved clock controller, arranged to generate a first clock signal and a second clock signal according to a master clock signal; and a multi-ADC circuit, coupled to the interleaved clock controller, arranged to perform analog-to-digital conversion. The multi-ADC circuit includes a first ADC and a second ADC, wherein the first ADC performs sampling and conversion operations according to the first clock signal, and the second ADC performs sampling and conversion operations according to the second clock signal. Based on the timing control of the first clock signal and the second clock signal, when any ADC of the first ADC and the second ADC is performing a sampling operation, the other ADC of the first ADC and the second ADC suspends conversion.

20 Claims, 7 Drawing Sheets

ANALOG-TO-DIGITAL CONVERTER DEVICE EQUIPPED WITH CONVERSION SUSPENSION FUNCTION, AND OPERATION METHOD THEREOF

BACKGROUND OF THE INVENTION

1. Field of the Invention

The present invention relates to analog-to-digital converters (ADCs), and more particularly, to an ADC device equipped with a conversion suspension function and an operation method thereof.

2. Description of the Prior Art

Among various types of ADCs, the operation speed of the successive approximation register (SAR) ADC is faster than the operation speed of the delta-sigma ADC, but is slower than the operation speed of the pipeline ADC. The SAR ADC can make the power consumption of the circuit architecture become lower and make the size of the circuit architecture more compact. According to the related art, interleaving control can increase the overall operation speed of the SAR ADC circuit architecture to reduce the speed gap between the SAR ADC circuit architecture and the pipeline ADC circuit architecture. However, there is a tough problem with the interleaving control. In the interleaving-control-based SAR ADC circuit architecture, a common reference voltage used by an ADC that is performing a conversion operation may be interfered with by the noise of another ADC that is performing a sampling operation. For example, if the interference does not disappear within a half-cycle of a master clock, the currently converted bit may be erroneous, which may lead to a differential non-linearity (DNL) problem of the output code of the ADC that is very sensitive to bit decision. Conventional methods arranged to try solving this problem may comprise:
(1) reducing the reference pin inductance, which typically makes the overall cost become very high or makes the package be limited;
(2) reducing the clock frequency, which conflicts with the goal of using interleaving to speed up, and is therefore unreasonable;
(3) using a resistor-capacitor (RC) filter to isolate the ADC reference voltage, which typically makes the current-resistance (IR) drop or the overall cost become unacceptable; and
(4) if the reference voltage generator is on the chip, increasing the response speed, which typically makes the entire circuit architecture become very power-consuming; where the conventional methods listed above will bring their own side effects. Therefore, a low-cost solution is needed to solve the above-mentioned DNL problem.

SUMMARY OF THE INVENTION

An object of the present invention is to provide an analog-to-digital converter (ADC) device equipped with a conversion suspension function, and an operation method thereof, to solve the above-mentioned problems.

Another object of the present invention is to provide an ADC device equipped with a conversion suspension function, and an operation method thereof, in order to achieve the optimal performance of an electronic device without side effects or in a way that is less likely to introduce a side effect.

According to at least one embodiment, an ADC device equipped with a conversion suspension function is provided. The ADC device may comprise an interleaved clock controller and a multi-ADC circuit that is coupled to the interleaved clock controller. The interleaved clock controller can be configured to generate a first clock signal and a second clock signal according to a master clock signal, wherein the first clock signal and the second clock signal are different from each other at at least one time point. In addition, the multi-ADC circuit can be configured to perform analog-to-digital conversion, wherein the multi-ADC circuit comprises: a first ADC, wherein the first ADC performs sampling and conversion operations according to the first clock signal; and a second ADC, wherein the second ADC performs sampling and conversion operations according to the second clock signal. Additionally, based on timing control of the first clock signal and the second clock signal, when any ADC of the first ADC and the second ADC is performing a sampling operation, another ADC of the first ADC and the second ADC suspends any conversion operation.

According to at least one embodiment, an operation method of an ADC device equipped with a conversion suspension function is provided. The operation method may comprise: utilizing an interleaved clock controller in the ADC device to generate a first clock signal and a second clock signal according to a master clock signal, wherein the first clock signal and the second clock signal are different from each other at at least one time point; and utilizing a multi-ADC circuit in the ADC device to perform analog-to-digital conversion, wherein a first ADC in the multi-ADC circuit performs sampling and conversion operations according to the first clock signal, and a second ADC in the multi-ADC circuit performs sampling and conversion operations according to the second clock signal; wherein based on timing control of the first clock signal and the second clock signal, when any ADC of the first ADC and the second ADC is performing a sampling operation, another ADC of the first ADC and the second ADC suspends any conversion operations.

According to some embodiments, each clock signal of the first clock signal and the second clock signal is a modified clock signal obtained from modifying the master clock signal.

In comparison with the conventional architecture, the ADC device equipped with a conversion suspension function in the present invention can achieve extremely high overall performance without side effects or in a way that is less likely to introduce a side effect. In addition, implementing the embodiments of the present invention can achieve the goals of low cost and high speed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates in the upper half thereof the case of temporarily disabling the conversion suspension function.

DETAILED DESCRIPTION

Figure 1:
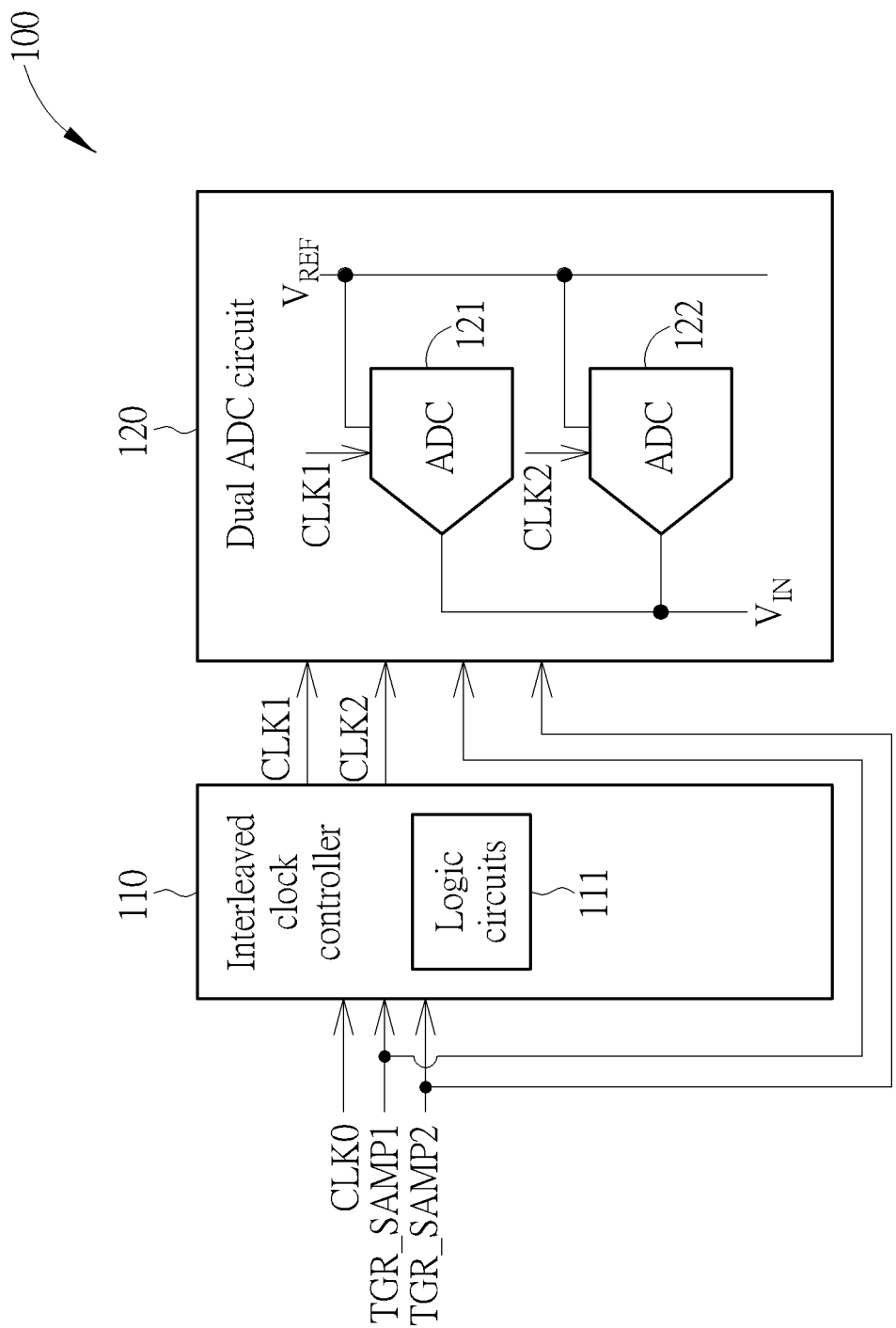
FIG. 1 is a diagram of an ADC device equipped with a conversion suspension function according to an embodiment of the present invention.

FIG. 1 is a diagram of an analog-to-digital converter (ADC) device 100 equipped with a conversion suspension function according to an embodiment of the present invention. The ADC device 100 may comprise an interleaved clock controller 110 and a multi-ADC circuit coupled to the interleaved clock controller 110, such as a dual ADC circuit 120. For better comprehension, the multi-ADC circuit may comprise multiple ADCs sharing at least one reference voltage such as a reference voltage $V_{REF}$ and sharing an analog input signal $V_{IN}$, such as multiple successive approximation register (SAR) ADCs, wherein the number X of the multiple ADCs may be greater than or equal to two (e.g. the symbol "X" may represent a positive integer, and X≥2). For example, in a situation where there are only two ADCs among the multiple ADCs (e.g., X=2), the multi-ADC circuit can be illustrated as the dual ADC circuit 120 shown in FIG. 1, and more particularly, the multi-ADC circuit such as the dual ADC circuit 120 may comprise ADCs 121 and 122 that share the aforementioned at least one reference voltage such as the reference voltage $V_{REF}$ and share the analog input signal $V_{IN}$, as shown in FIG. 1, but the invention is not limited thereto. According to some embodiments, the multi-ADC circuit may comprise three or more ADCs (e.g., X>2). In addition, as the interleaved clock controller 110 can be implemented by way of logic circuits, etc., the interleaved clock controller 110 can be illustrated to comprise the logic circuits 111. For example, the logic circuits 111 may comprise logic gates, delay cells, etc., but the invention is not limited thereto.

As shown in FIG. 1, the interleaved clock controller 110 (e.g. the logic circuits 111 therein) can generate a first clock signal and a second clock signal according to a master clock signal CLK0, and more particularly, modify the master clock signal CLK0 to generate a modified clock signal CLK1 as the first clock signal, and modify the master clock signal CLK0 to generate a modified clock signal CLK2 as the second clock signal, where the first clock signal such as the modified clock The signal CLK1 and the second clock signal such as the modified clock signal CLK2 are different from each other at at least one time point (e.g. one or more time points). In addition, the multi-ADC circuit such as the dual ADC circuit 120 can perform analog-to-digital conversion, where the ADC 121 performs sampling and conversion operations according to the first clock signal such as the modified clock signal CLK1, and the ADC 122 performs sampling and conversion operations according to the second clock signal such as the modified clock signal CLK2. As the ADCs 121 and 122 respectively receive and refer to different clock signals such as the modified clock signals CLK1 and CLK2 (rather than the same clock signal such as the master clock signal CLK0) to perform analog-to-digital conversion, the interleaved clock controller 110 (e.g. the logic circuits 111 therein) can play the original role thereof (e.g. the role of transmitting at least one clock signal to the multiple ADCs such as the ADCs 121 and 122) and a first additional role (e.g. the role of the controller regarding the conversion suspension function) at the same time, and more particularly, perform additional control such as the control regarding the conversion suspension function on the ADCs 121 and 122 through the modified clock signals CLK1 and CLK2 respectively carrying additional control information.

Regarding the first additional role, the interleaved clock controller 110 (e.g. the logic circuits 111 therein) can modify the master clock signal CLK0 according to the sampling trigger signal TGR_SAMP2 to generate the modified clock signal CLK1, to make the modified clock signal CLK1 carry the additional control information thereof, such as the conversion suspension control information of the ADC 121, and can modify the master clock signal CLK0 according to the sampling trigger signal TGR_SAMP1 to generate the modified clock signal CLK2, to make the modified clock signal CLK2 carry the additional control information thereof, such as the conversion suspension control information of the ADC 122, where the sampling trigger signals TGR_SAMP1 and TGR_SAMP2 can be configured to trigger the sampling operations of the ADCs 121 and 122, respectively, and can be generated by a signal conversion circuit positioned outside the interleaved clock controller 110, but the present invention is not limited thereto.

Based on the timing control of the first clock signal such as the modified clock signal CLK1 and the second clock signal such as the modified clock signal CLK2, when any ADC of the ADCs 121 and 122 is performing a sampling operation, the other ADC of the ADCs 121 and 122 can suspend conversion. In comparison with the conventional architecture, the ADC device 100 of the present invention can control the other ADC to suspend conversion, to achieve extremely high overall performance without side effects or in a way that is less likely to introduce a side effect, where the present invention can achieve the goals of low cost and high speed.

According to some embodiments, the signal conversion circuit can be integrated into the interleaved clock controller 110. In this situation, the interleaved clock controller 110 (e.g. the logic circuits 111 therein) can play the original role, the first additional role, and a second additional role (e.g. the role of the controller for triggering the sampling operations of the ADCs 121 and 122) at the same time, and the sampling trigger signals TGR_SAMP1 and TGR_SAMP2 can become internal signals of the interleaved clock controller 110.

According to some embodiments, no matter whether the signal conversion circuit is integrated into the interleaved clock controller 110 or not, the signal conversion circuit can be implemented by way of logic circuits, etc., and more particularly, may comprise one or more frequency dividers, one or more logic gates, etc. For example, the signal conversion circuit can utilize the above-mentioned one or more frequency dividers to perform frequency dividing on the master clock signal CLK0 and/or utilize the above-mentioned one or more logic gates to perform logic control, to generate X sampling trigger signals (e.g. pulse waves) respectively carrying pulses aligned to some predetermined sampling time points, such as the sampling trigger signals TGR_SAMP1 and TGR_SAMP2, and X conversion trigger signals (e.g. pulse waves) respectively carrying pulses aligned to some predetermined conversion time points, for controlling the respective sampling and conversion operations of the multiple ADCs such as the ADCs 121 and 122, to make the multiple ADCs such as the ADCs 121 and 122 perform the sampling and conversion operations in an interleaved manner to complete the analog-to-digital conversion, but the invention is not limited thereto.

Figure 2:
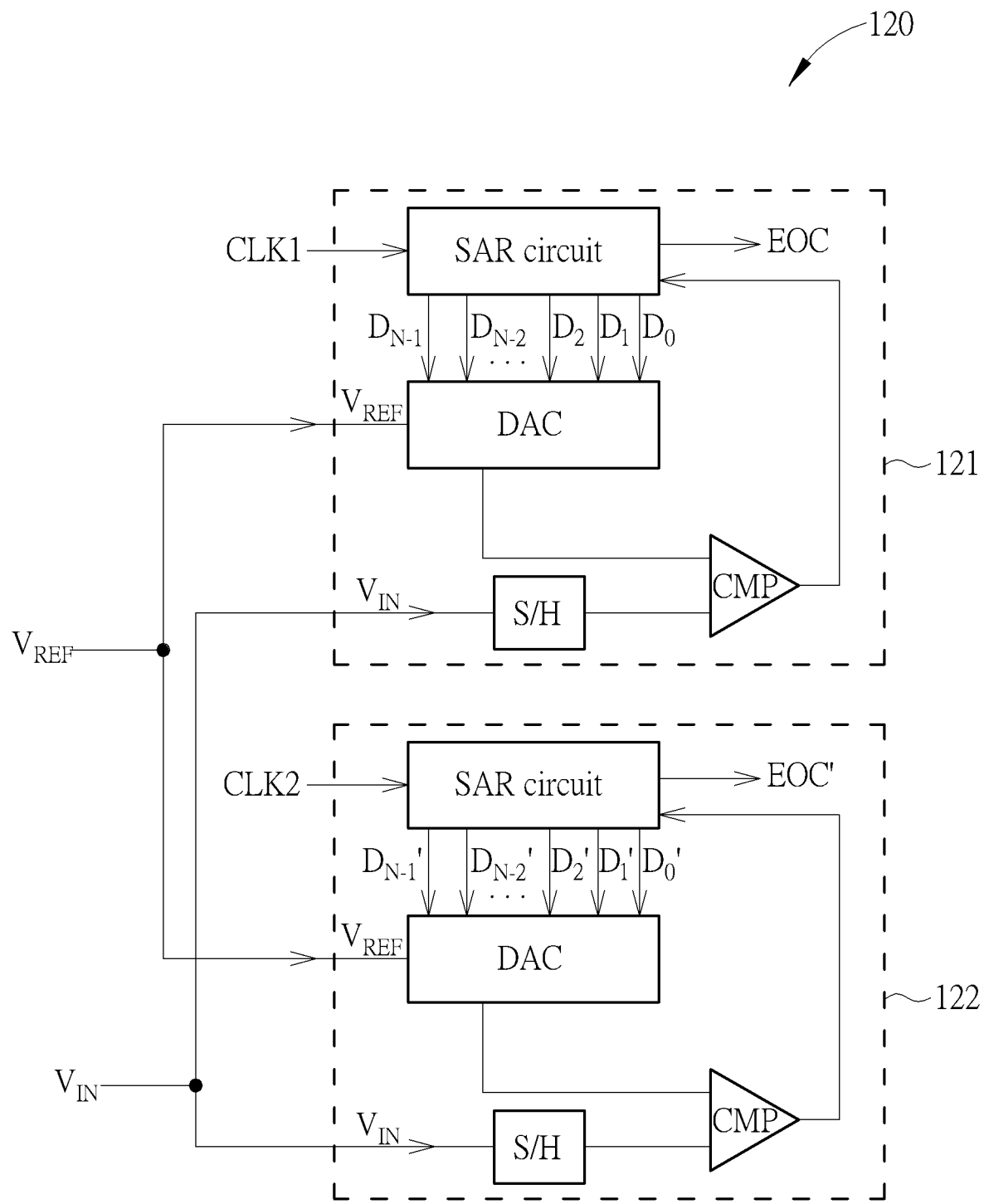
FIG. 2 is a diagram illustrating a successive approximation register (SAR) ADC circuit structure of a dual ADC circuit shown in FIG. 1 according to an embodiment of the present invention.

FIG. 2 is a diagram illustrating a SAR ADC circuit structure of the dual ADC circuit 120 shown in FIG. 1 according to an embodiment of the present invention. For example, each ADC of the ADCs 121 and 122 may be a SAR ADC, and more particularly, may comprise a SAR circuit, a digital-to-analog converter (DAC), a sample and hold (S/H) circuit (labeled "S/H" in FIG. 2 for brevity) and a comparator (labeled "CMP" in FIG. 2 for brevity). The SAR circuit may comprise multiple registers arranged to temporarily store multiple bits, respectively.

In a certain ADC (e.g. the any ADC or the other ADC) of the ADCs 121 and 122, the sample and hold circuit can sample a voltage level of the analog input signal $V_{IN}$ during a sampling phase to hold this voltage level as a stable voltage, to allow the comparator to compare this voltage level with a known voltage during a conversion phase. This known voltage is provided by the DAC, and the DAC is powered by the aforementioned at least one reference voltage such as the reference voltage $V_{REF}$. A digital input of the DAC, such as a temporary digital word, may comprise a set of bits (e.g. a set of bits $D_{N-1}$, $D_{N-2}$, ..., $D_2$, $D_1$, and $D_0$ in the ADC 121, or a set of bits $D_{N-1}'$, $D_{N-2}'$, ..., $D_2'$, $D_1'$, and $D_0'$ in ADC 122) generated and output by the SAR circuit. Based on the successive approximation principle, the SAR circuit can generate this digital input such as this temporary digital word according to a comparison result of the comparator. The SAR circuit can initially generate a digital word corresponding to a half-voltage range (e.g. (½) $V_{REF}$). If the comparison result from the comparator is equal to zero (which may indicate that $V_{IN}$<(½) $V_{REF}$), the SAR circuit can generate a digital word corresponding to a further reduced voltage range (e.g. (¼) $V_{REF}$) in the next step. In each step of the successive approximation, the SAR circuit can add or subtract the $2^n$ weight according to the latest comparison result from the comparator to generate the latest digital word (e.g. the symbol "n" may represent a positive integer, and may correspond to the number of steps in the successive approximation). After N steps, the SAR circuit can generate the final digital word as a digital output of this ADC (e.g. a digital output signal EOC in the ADC 121, or a digital output signal EOC' in the ADC 122). As the successive approximation principle is well known to those skilled in the SAR ADC field, the associated details are omitted here for brevity.

Figure 3:
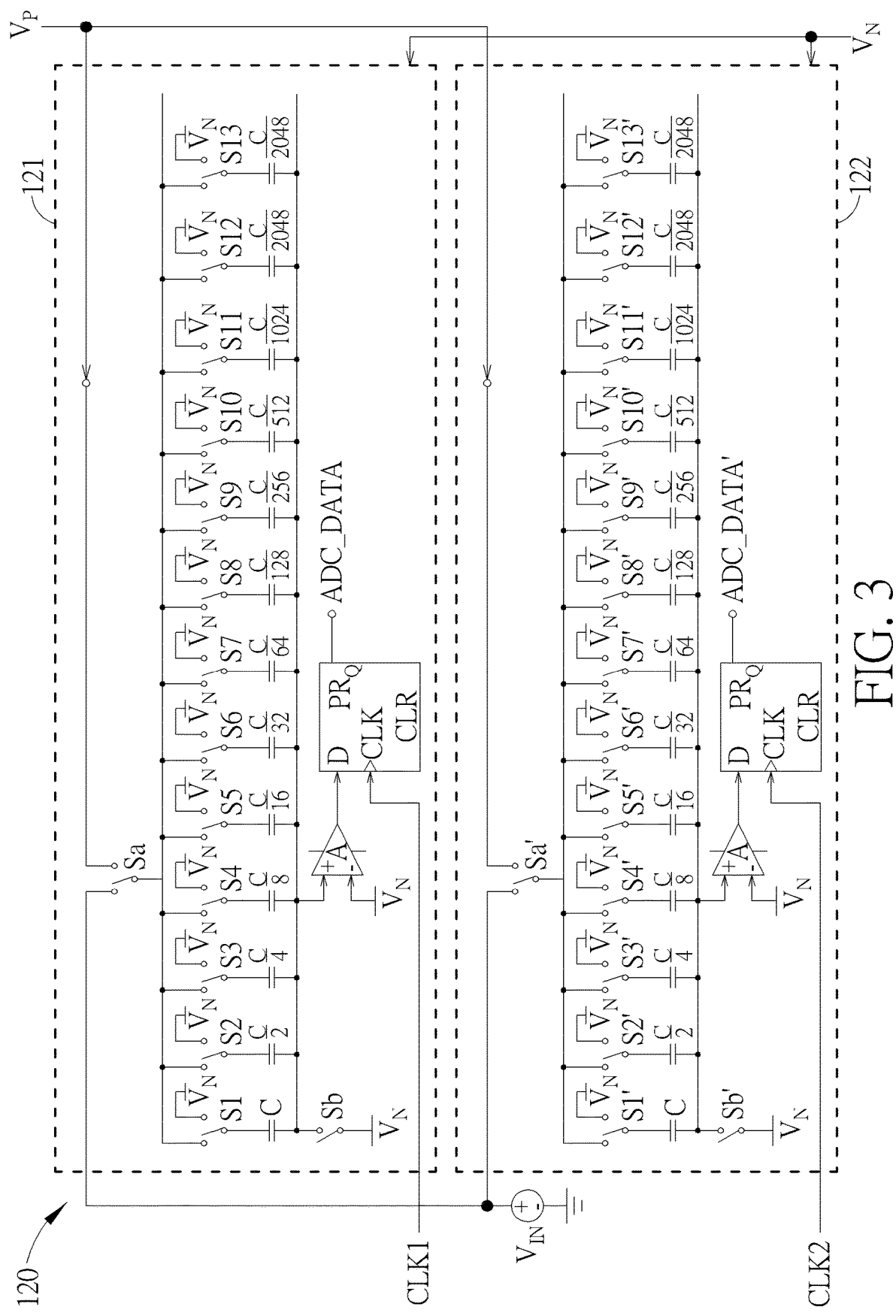
FIG. 3 illustrates some implementation details of the dual ADC circuit shown in FIG. 1 according to an embodiment of the present invention.

FIG. 3 illustrates some implementation details of the dual ADC circuit 120 shown in FIG. 1 according to an embodiment of the present invention. The circuit architectures of the ADCs 121 and 122 can be the same or similar to each other. For better comprehension, the bit count N of the digital output of each ADC of the ADCs 121 and 122 can be equal to 12, but the present invention is not limited thereto.

As shown in the upper half of FIG. 3, the ADC 121 may comprise multiple capacitors respectively having capacitance values C, C/2, C/4, C/8, C/16, C/32, C/64, C/128, C/256, C/512, C/1024, C/2048 and C/2048 and multiple switches S1, S2, S3, S4, S5, S6, S7, S8, S9, S10, S11, S12, and S13 corresponding to these capacitors, and may comprise multiple switches Sa and Sb for switching an upper wire and a lower wire, respectively, an amplifier (labeled "A" in FIG. 3 for brevity) used as the comparator in the ADC 121, and a flip-flop (FF) having multiple terminals D, CLK, CLR and $PR_Q$, where this flip-flop outputs ADC data ADC_DATA, which can be taken as an example of the digital output signal EOC shown in FIG. 2.

As shown in the lower half of FIG. 3, the ADC 122 may comprise multiple capacitors respectively having capacitance values C, C/2, C/4, C/8, C/16, C/32, C/64, C/128, C/256, C/512, C/1024, C/2048 and C/2048 and multiple switches S1', S2', S3', S4', S5', S6', S7', S8', S9', S10', S11', S12', and S13' corresponding to these capacitors, and may comprise multiple switches Sa' and Sb' for switching an upper wire and a lower wire, respectively, an amplifier (labeled "A" in FIG. 3 for brevity) used as the comparator in the ADC 122, and a flip-flop (FF) having multiple terminals D, CLK, CLR and $PR_Q$, where this flip-flop outputs ADC data ADC_DATA', which can be taken as an example of the digital output signal EOC' shown in FIG. 2.

The ADCs 121 and 122 can share the aforementioned at least one reference voltage such as the reference voltages $V_P$ and $V_N$. The reference voltages $V_P$ and $V_N$ may represent the maximum voltage and the minimum voltage of a conversion voltage range, respectively. For example, the ADCs 121 and 122 may receive the reference voltage $V_{REF}$ and a ground voltage as the reference voltages $V_P$ and $V_N$, respectively, but the invention is not limited thereto. After obtaining the teachings of the above embodiments, those skilled in the SAR ADC field should be able to understand the operation method of the circuit architecture shown in FIG. 3. For brevity, similar descriptions for this embodiment are not repeated in detail here.

Figure 4:
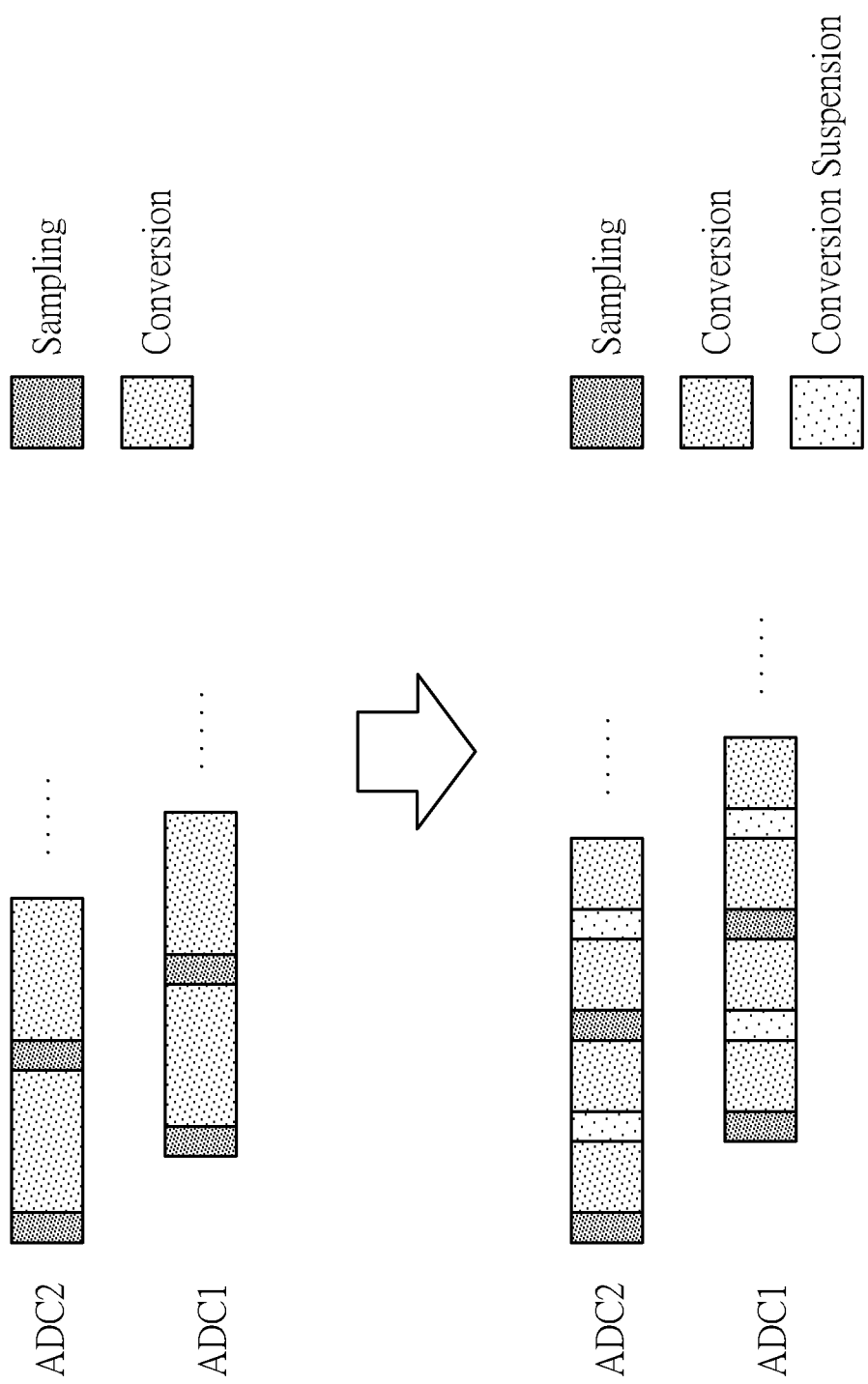
FIG. 4 illustrates in the lower half thereof the conversion suspension function of the ADC device shown in FIG. 1 according to an embodiment of the present invention, wherein for better comprehension.

FIG. 4 illustrates in the lower half thereof the conversion suspension function of the ADC device 100 shown in FIG. 1 according to an embodiment of the present invention, wherein for better comprehension, FIG. 4 illustrates in the upper half thereof the case of temporarily disabling the conversion suspension function. Two ADCs ADC1 and ADC2 of the multiple ADCs may represent the ADCs 121 and 122, respectively, but the invention is not limited thereto. For example, the two ADCs ADC1 and ADC2 may represent the ADCs 122 and 121, respectively. FIG. 4 indicates various states of the two ADCs ADC1 and ADC2, such as a sampling state, a conversion state, and a conversion suspension state (respectively labeled as "Sampling", "Conversion" and "Conversion Suspension" in FIG. 4 for brevity).

Regarding the case shown in the upper half of FIG. 4, as the two ADCs ADC1 and ADC2 share the above-mentioned at least one reference voltage such as the reference voltage $V_{REF}$, the noise generated by the ADC that is performing sampling may interfere with the ADC that is performing conversion. When the ADC ADC2 is performing sampling, the noise generated by the ADC ADC2 may interfere with the ADC ADC1 that is performing conversion, which may cause occurrence of one or more errors in the digital output of the ADC ADC1. When the ADC ADC1 is performing sampling, the noise generated by the ADC ADC1 may interfere with the ADC ADC2 that is performing conversion, which may cause occurrence of one or more errors in the digital output of the ADC ADC2.

Regarding the case shown in the lower half of FIG. 4, under the control of the interleaved clock controller 110 (e.g. the logic circuits 111 therein), each clock signal of the first clock signal such as the modified clock signal CLK1 and the second clock signal such as the modified clock signal CLK2 may have a plurality of suspension time intervals (e.g. the time intervals corresponding to the above-mentioned conversion suspension state), for controlling the other ADC to suspend the any conversion operation when the any ADC is performing the sampling operation, and more particularly, the plurality of suspension time intervals can be periodic suspension time intervals.

Figure 5:
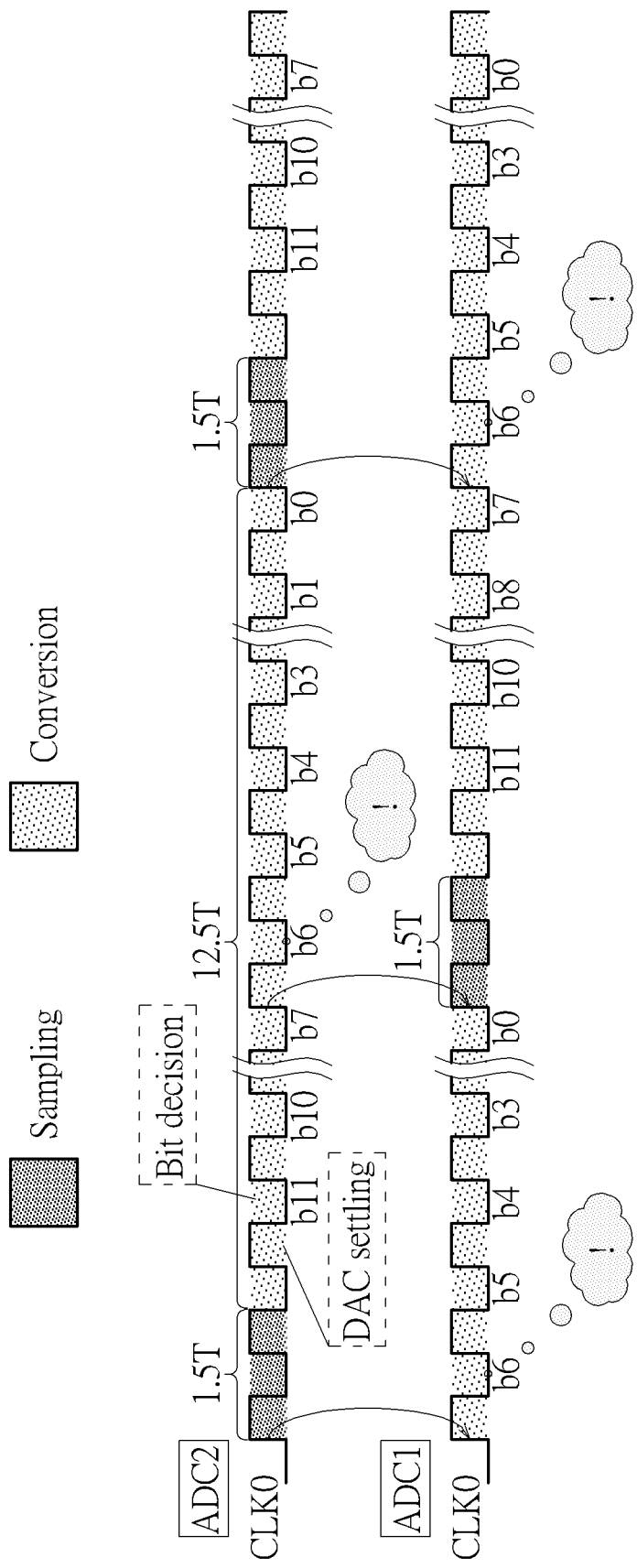
FIG. 5 illustrates an example of the case shown in the upper half of FIG. 4.
Figure 6:
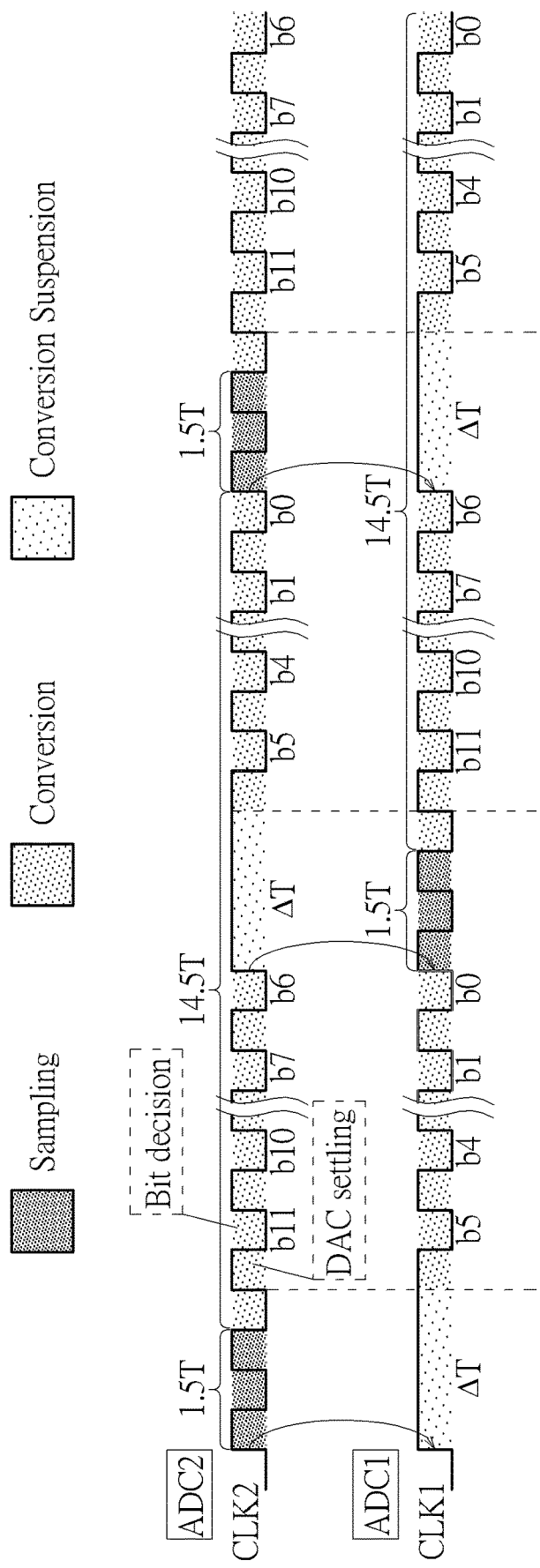
FIG. 6 illustrates an example of the case shown in the lower half of FIG. 4.

FIG. 5 illustrates an example of the case shown in the upper half of FIG. 4, and FIG. 6 illustrates an example of the case shown in the lower half of FIG. 4. For better comprehension, the digital output of any ADC of these two ADCs ADC1 and ADC2 may comprise N bits such as bits b11, b10, b9, b8, b7, b6, b5, b4, b3, b2, b1, and b0. In addition, assume that 1T may represent the period of the master clock signal CLK0, so 1.5T, 2T, 2.5T, . . . , 12.5T, . . . , 14.5T, etc. may represent 1.5 times, 2 times, 2.5 times, . . . , 12.5 times, . . . , 14.5 times, etc. the period 1T of the master clock signal CLK0, respectively. Additionally, during the conversion performed by the aforementioned any ADC of the two ADCs ADC1 and ADC2, this ADC can wait for the DAC settling (i.e. the settling of the DAC therein) in a certain half period (e.g. a positive half period, such as the positive half cycle corresponding to the high voltage level of the clock signal received by this ADC), and complete the DAC settling before the end of this half period, and can perform comparator decision in the next half period immediately coming after this half period (e.g. a negative half period, such as the negative half cycle corresponding to the low voltage level of the clock signal received by this ADC), and more particularly, obtain the output of the comparator therein as a corresponding bit to complete the bit decision of the corresponding bit. The bit b11 can be taken as an example of the corresponding bit, but the present invention is not limited thereto. Any bit of the remaining bits among the N bits, such as any of the bits b10, b9, b8, b7, b6, b5, b4, b3, b2, b1, and b0, can be taken as an example of the corresponding bit.

As shown in FIG. 5, in a situation where the conversion suspension function is temporarily disabled, the interleaved clock controller 110 can directly replace the modified clock signals CLK1 and CLK2 with the master clock signal CLK0, for being used by these two ADCs ADC1 and ADC2. When the ADC ADC2 is performing sampling, the noise generated by the ADC ADC2 will interfere with the ADC ADC1 that is performing conversion, causing occurrence of one or more errors in the digital output of the ADC ADC1 (labeled "!" in FIG. 5 for better comprehension). When the ADC ADC1 is performing sampling, the noise generated by the ADC ADC1 will interfere with the ADC ADC2 that is performing conversion, causing occurrence of one or more errors in the digital output of the ADC ADC2 (labeled "!" in FIG. 5 for better comprehension).

As shown in FIG. 6, the length of each suspension time interval of the plurality of suspension time intervals may be equal to a predetermined time length $\Delta T$. In general, the predetermined time length $\Delta T$ may be at least twice (e.g. 2 times, 3 times, 4 times, etc.) the period 1T of the master clock signal CLK0. In the example shown in FIG. 6, the predetermined time length $\Delta T$ is twice the period 1T of the master clock signal CLK0, that is, $\Delta T=2T$. In addition, the interleaved clock controller 110 (e.g. the logic circuits 111 therein) can delay the first clock signal such as the modified clock signal CLK1 and the second clock signal such as the modified clock signal CLK2 in turn, for controlling the other ADC to suspend the any conversion operation when the any ADC is performing the sampling operation, but the present invention is not limited thereto. For example, the interleaved clock controller 110 (e.g. the logic circuits 111 therein) can lock the voltage level of the first clock signal and the voltage level of the second clock signal in turn, for controlling the other ADC to suspend the any conversion operation when the any ADC is performing the sampling operation.

Under the control of the interleaved clock controller 110 (e.g. the logic circuits 111 therein), the modified clock signal CLK1 may have a plurality of first suspension time intervals (e.g. a suspension time interval labeled the predetermined time length $\Delta T$ in the modified clock signal CLK1), and the second modified clock signal CLK2 may have a plurality of second suspension time intervals (e.g. a suspension time interval labeled the predetermined time length $\Delta T$ in the modified clock signal CLK2), where the plurality of first suspension time intervals and the plurality of second suspension time intervals are different from each other. More particularly, the plurality of first suspension time intervals and the plurality of second suspension time intervals are interleaved with each other.

Figure 7:
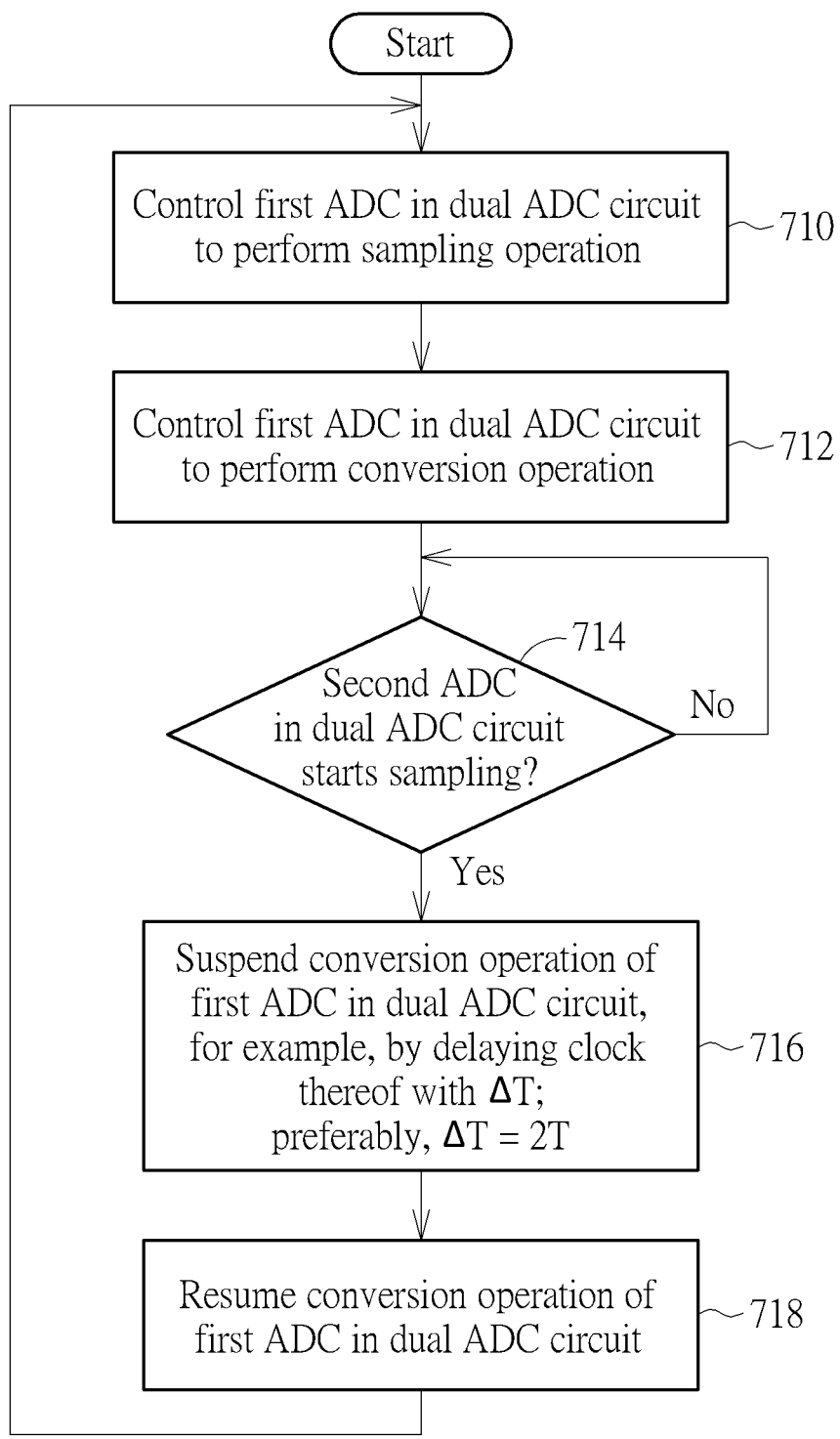
FIG. 7 is a flowchart of an operation method of the ADC device shown in FIG. 1 according to an embodiment of the present invention.

FIG. 7 is a flowchart of an operation method of the ADC device 100 shown in FIG. 1 according to an embodiment of the present invention.

In Step 710, the interleaved clock controller 110 (e.g. the logic circuits 111 therein) can control a first ADC (e.g. the ADC ADC1 such as the ADC 121) in the dual ADC circuit 120 to perform a sampling operation.

In Step 712, the interleaved clock controller 110 (e.g. the logic circuits 111 therein) can control the first ADC (e.g. the ADC ADC1 such as the ADC 121) in the dual ADC circuit 120 to perform a conversion operation.

In Step 714, the interleaved clock controller 110 (e.g. the logic circuits 111 therein) can check whether a second ADC (e.g. the ADC ADC2 such as the ADC 122) in the dual ADC circuit 120 starts sampling. If Yes, Step 716 is entered; if No, Step 714 is entered again.

In Step 716, the interleaved clock controller 110 (e.g. the logic circuits 111 therein) can suspend the conversion operation of the first ADC (e.g. the ADC ADC1 such as the ADC 121) in the dual ADC circuit 120, for example, by delaying the clock thereof with a delay amount such as $\Delta T$; preferably, $\Delta T=2T$.

In Step 718, the interleaved clock controller 110 (e.g. the logic circuits 111 therein) can resume the conversion operation of the first ADC (e.g. the ADC ADC1 such as the ADC 121) in the dual ADC circuit 120.

For better comprehension, the ADCs 121 and 122 can be taken as examples of the first ADC (e.g. the ADC ADC1) and the second ADC (e.g. the ADC ADC2) of this embodiment, respectively, but the present invention is not limited thereto. The ADCs 121 and 122 can be taken as examples of the second ADC (e.g. the ADC ADC2) and the first ADC (e.g. the ADC ADC1) of this embodiment, respectively. For brevity, similar descriptions for this embodiment are not repeated in detail here.

In addition, the operation method can be illustrated with the workflow shown in FIG. 7, but the present invention is not limited thereto. According to some embodiments, one or more steps can be added, deleted or changed in the workflow shown in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter (ADC) device equipped with a conversion suspension function, comprising:
   an interleaved clock controller, arranged to generate a first clock signal and a second clock signal according to a master clock signal, wherein the first clock signal and the second clock signal are different from each other at at least one time point; and a multi-ADC circuit, coupled to the interleaved clock controller, arranged to perform analog-to-digital conversion, wherein the multi-ADC circuit comprises:
   a first ADC, wherein the first ADC performs sampling and conversion operations according to the first clock signal; and
   a second ADC, wherein the second ADC performs sampling and conversion operations according to the second clock signal;

wherein based on timing control of the first clock signal and the second clock signal, when any ADC of the first ADC and the second ADC is performing a sampling operation, another ADC of the first ADC and the second ADC suspends any conversion operation.

2. The ADC device of claim 1, wherein each ADC of the first ADC and the second ADC is a successive approximation register (SAR) ADC.

3. The ADC device of claim 1, wherein each clock signal of the first clock signal and the second clock signal has a plurality of suspension time intervals, for controlling said another ADC to suspend said any conversion operation when said any ADC is performing the sampling operation.

4. The ADC device of claim 3, wherein the plurality of suspension time intervals are periodic suspension time intervals.

5. The ADC device of claim 3, wherein a length of each suspension time interval of the plurality of suspension time intervals is equal to a predetermined time length.

6. The ADC device of claim 5, wherein the predetermined time length is at least twice a period of the master clock signal.

7. The ADC device of claim 1, wherein the interleaved clock controller delays the first clock signal and the second clock signal in turn, for controlling said another ADC to suspend said any conversion operation when said any ADC is performing the sampling operation.

8. The ADC device of claim 1, wherein the interleaved clock controller locks a voltage level of the first clock signal and a voltage level of the second clock signal in turn, for controlling said another ADC to suspend said any conversion operation when said any ADC is performing the sampling operation.

9. The ADC device of claim 1, wherein the interleaved clock controller further comprises:
   logic circuits, arranged to modify the master clock signal to generate a first modified clock signal as the first clock signal, and modify the master clock signal to generate a second modified clock signal as the second clock signal.

10. The ADC device of claim 9, wherein the first modified clock signal has a plurality of first suspension time intervals, and the second modified clock signal has a plurality of second suspension time intervals, wherein the plurality of first suspension time intervals and the plurality of second suspension time intervals are different from each other.

11. The ADC device of claim 10, wherein the plurality of first suspension time intervals and the plurality of second suspension time intervals are interleaved with each other.

12. The ADC device of claim 1, wherein each clock signal of the first clock signal and the second clock signal is a modified clock signal obtained from modifying the master clock signal.

13. An operation method of an analog-to-digital converter (ADC) device equipped with a conversion suspension function, comprising:
   utilizing an interleaved clock controller in the ADC device to generate a first clock signal and a second clock signal according to a master clock signal, wherein the first clock signal and the second clock signal are different from each other at at least one time point; and
   utilizing a multi-ADC circuit in the ADC device to perform analog-to-digital conversion, wherein a first ADC in the multi-ADC circuit performs sampling and conversion operations according to the first clock signal, and a second ADC in the multi-ADC circuit performs sampling and conversion operations according to the second clock signal;

wherein based on timing control of the first clock signal and the second clock signal, when any ADC of the first ADC and the second ADC is performing a sampling operation, another ADC of the first ADC and the second ADC suspends any conversion operations.

14. The operation method of claim 13, wherein each ADC of the first ADC and the second ADC is a successive approximation register (SAR) ADC.

15. The operation method of claim 13, wherein each clock signal of the first clock signal and the second clock signal has a plurality of suspension time intervals, for controlling said another ADC to suspend said any conversion operation when said any ADC is performing the sampling operation.

16. The operation method of claim 15, wherein the plurality of suspension time intervals are periodic suspension time intervals.

17. The operation method of claim 15, wherein a length of each suspension time interval of the plurality of suspension time intervals is equal to a predetermined time length.

18. The operation method of claim 17, wherein the predetermined time length is at least twice a period of the master clock signal.

19. The operation method of claim 13, wherein the interleaved clock controller delays the first clock signal and the second clock signal in turn, for controlling said another ADC to suspend said any conversion operation when said any ADC is performing the sampling operation.

20. The operation method of claim 13, wherein the interleaved clock controller locks a voltage level of the first clock signal and a voltage level of the second clock signal in turn, for controlling said another ADC to suspend said any conversion operation when said any ADC is performing the sampling operation.

* * * * *